United States Patent
Suzuki et al.

(10) Patent No.: US 10,103,182 B2
(45) Date of Patent: Oct. 16, 2018

(54) PHOTOELECTRIC CONVERSION APPARATUS AND IMAGE READING APPARATUS

(71) Applicant: CANON KABUSHIKI KAISHA, Tokyo (JP)

(72) Inventors: Tatsuya Suzuki, Kawasaki (JP); Toru Koizumi, Yokohama (JP); Masanori Ogura, Tokyo (JP); Takanori Suzuki, Tokyo (JP); Jun Iba, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/599,140

(22) Filed: May 18, 2017

(65) Prior Publication Data

US 2017/0345857 A1 Nov. 30, 2017

(30) Foreign Application Priority Data

May 24, 2016 (JP) ................. 2016-103716

(51) Int. Cl.
*H04N 1/04* (2006.01)
*H01L 27/146* (2006.01)
*H04N 1/028* (2006.01)

(52) U.S. Cl.
CPC .... *H01L 27/14605* (2013.01); *H01L 27/1463* (2013.01); *H01L 27/14643* (2013.01); *H04N 1/02805* (2013.01)

(58) Field of Classification Search
CPC ........... H01L 27/14605; H01L 27/1463; H01L 27/14643; H04N 1/02805

USPC .................................... 358/471, 474
See application file for complete search history.

(56) References Cited

U.S. PATENT DOCUMENTS 6,278,145 B1    8/2001  Kato
6,590,242 B1    7/2003  Kozuka et al.
6,815,791 B1*  11/2004  Dierickx ............ H01L 27/1443
                                                      257/215
(Continued)

FOREIGN PATENT DOCUMENTS

EP       2333834 A2      6/2011
JP       H09153604 A     6/1997
(Continued)

*Primary Examiner* — Houshang Safaipour
(74) *Attorney, Agent, or Firm* — Canon U.S.A., Inc. IP Division

(57) ABSTRACT

A photoelectric conversion apparatus includes a semiconductor substrate having one principle surface including recessed portions, and insulation bodies in the recessed portions. The semiconductor substrate includes photoelectric conversion elements each of which includes a first semiconductor region of a first conductivity type, a second semiconductor region of a second conductivity type, and a third semiconductor region of the second conductivity type which has at least a portion disposed nearer to the principle surface relative to the second semiconductor region. The second semiconductor region has a polarity of signal charge. The second semiconductor region is in contact with the first and third semiconductor regions. Signal charge paths are disposed between the recessed portions in a cross section perpendicular to the principle surface. At least one of the second and third semiconductor regions is positioned in directions of at least two of the signal charge paths.

39 Claims, 12 Drawing Sheets

(56) References Cited

U.S. PATENT DOCUMENTS

| | | | |
|---|---|---|---|
| 8,426,794 B2 * | 4/2013 | Itahashi | H01L 27/14609 250/208.1 |
| 8,471,301 B2 | 6/2013 | Kudo et al. | |
| 8,912,034 B2 | 12/2014 | Kawabata | |
| 9,431,449 B2 * | 8/2016 | Toda | H01L 27/14603 |
| 2007/0210396 A1 | 9/2007 | Omi | |

FOREIGN PATENT DOCUMENTS

| | | |
|---|---|---|
| JP | 2004312039 A | 11/2004 |
| JP | 2011124522 A | 6/2011 |
| RU | 2325780 C2 | 5/2008 |
| RU | 2497234 C2 | 10/2013 |
| TW | 201125113 A | 7/2011 |
| TW | 201227830 A | 7/2012 |
| TW | 201517255 A | 5/2015 |
| TW | 201517258 A | 5/2015 |
| WO | 2009/136665 A1 | 11/2009 |

* cited by examiner

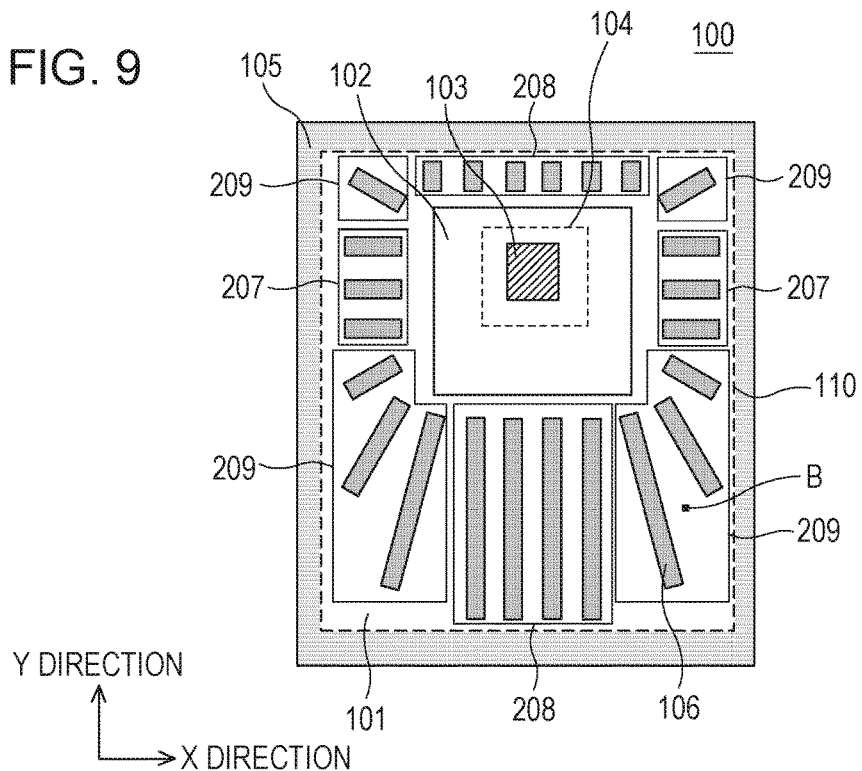
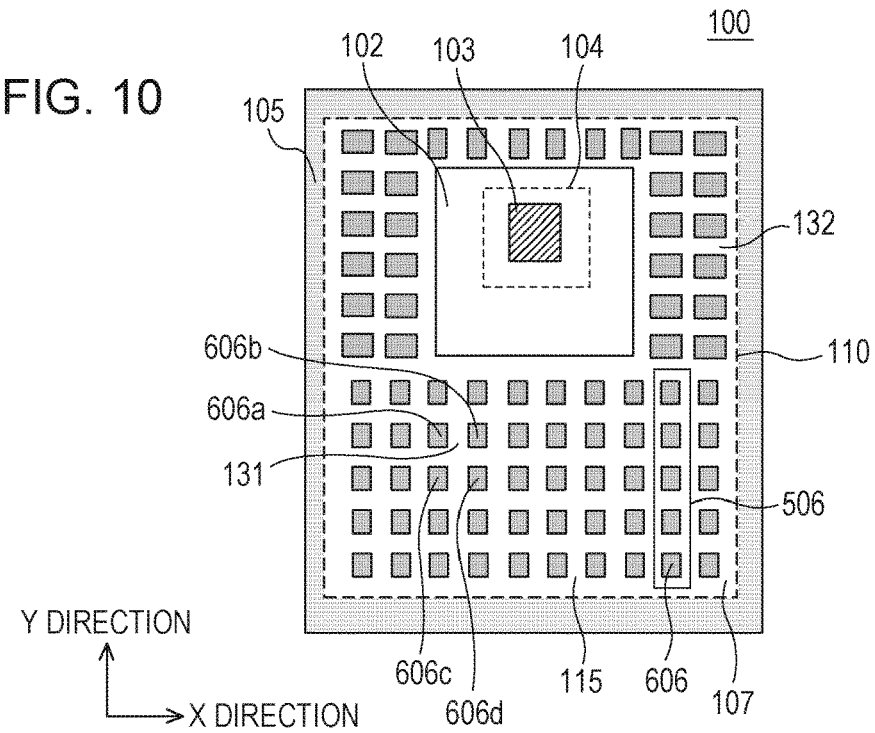

PHOTOELECTRIC CONVERSION APPARATUS AND IMAGE READING APPARATUS

BACKGROUND OF THE INVENTION

Field of the Invention

The present invention relates to a photoelectric conversion apparatus and an image reading apparatus.

Description of the Related Art

Photoelectric conversion apparatuses in which a photodiode formed by PN junction of first and second conductivity type semiconductor regions is used as a photoelectric conversion element, and image reading apparatuses using the photoelectric conversion apparatuses have been used. In general, image reading apparatuses require high sensitivity and high image quality. To improve the sensitivity, in FIG. 1 of Japanese Patent Laid-Open No. 2004-312039, a photoelectric conversion apparatus, which includes a large charge collection region formed thereon having polarity the same as charge to be collected so that charge collection efficiency is improved, has been proposed to address the disadvantage of increase in size of a light receiving area. Furthermore, a provision of a local oxidization of silicon (LOCOS) region on one principle surface of a photoelectric conversion element is disclosed in a Japanese Patent Laid-Open No. 2011-124522. Accordingly, a configuration of a photoelectric conversion apparatus which reduces occurrence of a state in which an output characteristic of the photoelectric conversion apparatus corresponds to a wave shape (a ripple) relative to a wavelength of incident light is proposed in Japanese Patent Laid-Open No. 2011-124522.

SUMMARY OF THE INVENTION

According to an embodiment of the present invention, a photoelectric conversion apparatus includes a semiconductor substrate configured to have one principle surface including recessed portions, and insulation bodies configured to be disposed in the recessed portions. The semiconductor substrate includes photoelectric conversion elements each of which includes a first semiconductor region of a first conductivity type, a second semiconductor region of a second conductivity type which is opposite to the first conductivity type, and a third semiconductor region of the second conductivity type which has an impurity concentration higher than an impurity concentration of the second semiconductor region, and which has at least a portion disposed nearer to the principle surface relative to the second semiconductor region. The second semiconductor region has a polarity the same as a polarity of signal charge. The second semiconductor region is in contact with the first and third semiconductor regions. The first and second semiconductor regions form a PN junction portion. Signal charge paths are disposed between the recessed portions in a cross section perpendicular to the principle surface. The signal charge paths include, in a plan view of the principle surface, a first signal charge path having a length in a first direction longer than a length in a second direction which is different from the first direction, and a second signal charge path having a length in a third direction, which is different from the first direction, longer than a length in a fourth direction which is different from the third direction. At least one of the second and third semiconductor regions includes a region which is on a line parallel to the first direction and passing through the first signal charge path, and which is on a line parallel to the second direction and passing through the second signal charge path.

According to another embodiment of the present invention, a photoelectric conversion apparatus includes a semiconductor substrate configured to have one principle surface including recessed portions, and insulation bodies configured to be disposed in the recessed portions. The semiconductor substrate includes photoelectric conversion elements each of which includes a first semiconductor region of a first conductivity type and a second semiconductor region of a second conductivity type which is opposite to the first conductivity type. The second semiconductor region has a polarity the same as a polarity of signal charge. Each of the photoelectric conversion elements further includes a third semiconductor region of the second conductivity type which has an impurity concentration higher than an impurity concentration of the second semiconductor region, and which has at least a portion disposed nearer to the principle surface relative to the second semiconductor region, a fourth semiconductor region of the first conductivity type which is formed between the recessed portions in a cross section perpendicular to the principle surface, and which has an impurity concentration higher than an impurity concentration of the first semiconductor region, and a fifth semiconductor region which is formed in a depth direction of the fourth semiconductor region in the cross section perpendicular to the principle surface, and which has an impurity concentration of the first conductivity type lower than the impurity concentration of the fourth semiconductor region. The second semiconductor region is in contact with the first and third semiconductor regions. The first and second semiconductor regions form a PN junction portion. The fifth semiconductor region is positioned between the recessed portions in the cross section perpendicular to the principle surface. The fifth semiconductor region includes, in a plan view of the principle surface. A first portion having a length in a first direction longer than a length in a second direction which is different from the first direction, and a second portion having a length in a third direction, which is different from the first direction, longer than a length in a fourth direction which is different from the third direction. At least one of the second and third semiconductor regions includes a region which is on a line parallel to the first direction and passing through the first portion of the fifth semiconductor region and which is on a line parallel to the second direction passing through the second portion of the fifth semiconductor region.

Further features of the present invention will become apparent from the following description of exemplary embodiments with reference to the attached drawings.

BRIEF DESCRIPTION OF THE DRAWINGS

FIG. 9 is a plan view of a portion of a photoelectric conversion apparatus according to a second embodiment.

FIG. 10 is a plan view of a portion of a photoelectric conversion apparatus according to a third embodiment.

DESCRIPTION OF THE EMBODIMENTS

Hereinafter, examples of portions of a photoelectric conversion apparatus according to embodiments will be described with reference to the accompanying drawings. In the embodiments below, a case where electrons are used as signal charge is described. However, if holes are used as signal charge, a P-type semiconductor region is replaced by an N-type semiconductor region and an N-type semiconductor region is replaced by a P-type semiconductor region. Each of the embodiments of the present invention described below can be implemented solely or as a combination of a plurality of the embodiments or features thereof where necessary or where the combination of elements or features from individual embodiments in a single embodiment is beneficial.

It is assumed here that a LOCOS region is provided to reduce occurrence of a ripple as disclosed in Japanese Patent Laid-Open No. 2011-124522 in a photoelectric conversion apparatus having a large charge collection region of a polarity the same as that of charge to be collected disclosed in Japanese Patent Laid-Open No. 2004-312039. In this case, the LOCOS region does not serve as a movement path of signal charge (a signal charge path), and therefore, movement of charge is blocked depending on a position and a shape of the LOCOS region and a charge collection efficiency is degraded.

Figure 1A:
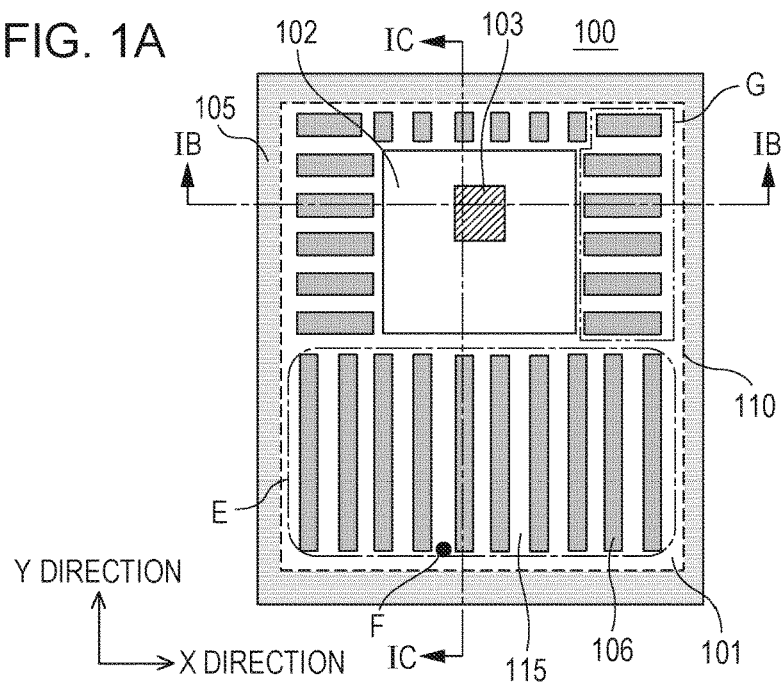
FIG. 1A is a plan view and FIGS. 1B and 1C are cross-sectional views of portions of a photoelectric conversion apparatus according to a first embodiment.
Figure 1B:
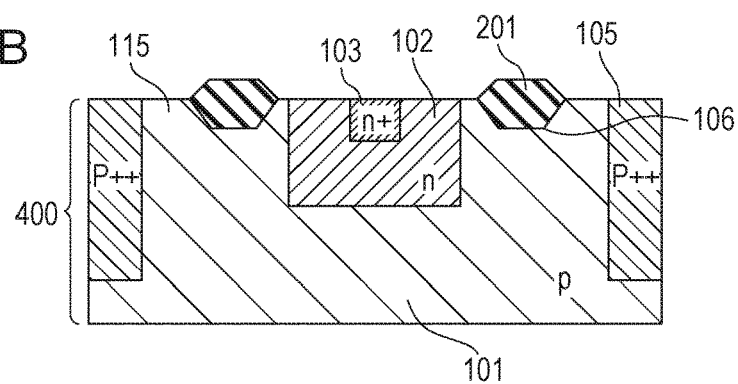
Figure 1C:
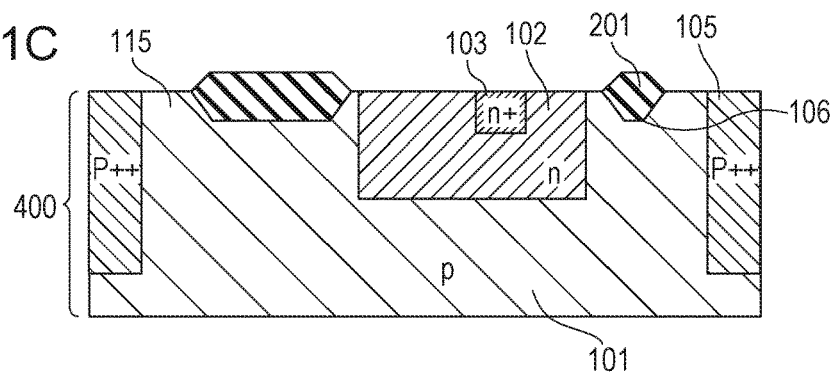

FIG. 1A is a plan view of an example of a portion of a photoelectric conversion apparatus according to this embodiment. FIGS. 1B and 1C are cross-sectional views taken along a line IB to IB and a line IC to IC of FIG. 1A, respectively. A photoelectric conversion apparatus 100 includes a plurality of photoelectric conversion elements 110 isolated by an element isolation portion 105.

Light enters from one principle surface having a plurality of recessed portions 106 included in a semiconductor substrate 400, passes a protective film or an interlayer insulation film, not illustrated, disposed on the principle surface of the semiconductor substrate 400, and is incident on the semiconductor substrate 400. The light may have spectral characteristics in which an output has a wave form (a ripple) relative to a wavelength due to multiple reflection on a boundary surface between the principle surface of the semiconductor substrate 400 and the interlayer insulation film, not illustrated, disposed on the principle surface. If flatness of the principle surface of the semiconductor substrate 400 is high, a ripple occurs in the output.

On the other hand, the photoelectric conversion apparatus 100 illustrated in FIG. 1A includes the semiconductor substrate 400 having the recessed portions 106 on the principle surface and insulation bodies 201 disposed on the recessed portions 106, for example. With this configuration, an optical path length until reflection of the principle surface of the semiconductor substrate 400 varies depending on an incident position of the light, and therefore, reflection light has a phase difference. Since the reflection light and the incident light having different phases interfere with each other, occurrence of a ripple on the output characteristics of the photoelectric conversion apparatus 100 may be reduced. For example, the plurality of recessed portions 106 may be formed by forming the LOCOS region on the semiconductor substrate 400.

The semiconductor substrate 400 (FIG. 1B) includes the photoelectric conversion element 110 including a first semiconductor region 101 of a first conductivity type (P type), a second semiconductor region 102 of a conductivity type (N type) opposite to the first conductivity type, and a third semiconductor region 103 of a second conductivity type. The conductivity types of the second semiconductor region 102 and the third semiconductor region 103 have a polarity the same as that of signal charge of the photoelectric conversion element 110. An impurity concentration of the third semiconductor region 103 is higher than that of the second semiconductor region 102, and at least a portion of the third semiconductor region 103 is disposed on the principle surface side relative to the second semiconductor region 102. Note that the impurity concentration means a net impurity concentration compensated with impurity of an opposite conductivity type, that is, a so-called NET concentration.

The second semiconductor region 102 is in contact with the first semiconductor region 101 and the third semiconductor region 103. In the photoelectric conversion apparatus 100, since the second semiconductor region 102 having a polarity the same as charge to be collected is formed in contact with the first semiconductor region 101 having a conductivity type different from the charge to be collected, PN junction is generated. Furthermore, the second semiconductor region 102 is in contact with the semiconductor region having the second conductivity type (the third semiconductor region 103) functioning as an electrode. Accordingly, charge may be collected in the third semiconductor region 103 through the second semiconductor region 102 using a drift phenomenon.

Accordingly, since the photoelectric conversion apparatus 100 includes the second semiconductor region 102, charge may be more efficiently collected when compared with a case where the photoelectric conversion apparatus 100 does not include the second semiconductor region 102 and the charge is collected in the third semiconductor region 103 by diffusion of the charge included in the first semiconductor region 101.

However, when the semiconductor substrate 400 includes a plurality of recessed portions 106 on the principle surface, the insulation bodies 201 disposed on the recessed portions 106 do not function as movement paths of signal charge. Accordingly, charge in a region on the principle surface side of the semiconductor substrate 400 moves in regions between the plurality of recessed portions 106 of the semiconductor substrate 400. Specifically, the photoelectric conversion apparatus 100 has a plurality of signal charge paths between the plurality of recessed portions 106 of the semiconductor substrate 400.

It is assumed here that, in the plan view of the principle surface, an extending direction of a first signal charge path positioned between a pair of the recessed portions 106 is determined as a first direction, and an extending direction of a second signal charge path between another pair of the recessed portions 106 is determined as a second direction. The second direction intersects with the first direction. It is further assumed here that, in this state, at least one of the second semiconductor region 102 and the third semiconductor region 103 is disposed in a region in the first direction of the first signal charge path, and in the second direction of the second signal charge path. Therefore, at least one of the second semiconductor region 102 and the third semiconductor region 103 includes a region which is on a line parallel to the first direction and passing through the first signal charge path, and which is on a line parallel to the second direction and passing through the second signal charge path. With this configuration of the photoelectric conversion apparatus 100, at least signal charge in the first and second signal charge paths moving to the second semiconductor region 102 or the third semiconductor region 103 is prevented from being blocked by the recessed portions 106. Furthermore, with this configuration, efficiency of collection of signal charge may be improved when compared with a case where the second semiconductor region 102 and the third semiconductor region 103 are disposed in only one of the extending directions of the signal charge paths between the plurality of recessed portions 106.

For example, in a region E of FIG. 1A, the first signal charge path between the recessed portions 106 in a first direction (a Y direction) is longer than that in a second direction (an X direction) which is different from the first direction. Furthermore, in a region G, the second signal charge path between the recessed portions 106 in a third direction (the X direction here) is longer than that in a fourth direction (the Y direction). Here, although a case where the first and third directions are orthogonal to each other is described in this embodiment, the directions are not limited to this as long as the first and third directions are different from (intersect with) each other. In the photoelectric conversion apparatus 100 described above, at least one of the second semiconductor region 102 and the third semiconductor region 103 is disposed in a region in the first direction of the first signal charge path and in the second direction of the second signal charge path.

With this configuration, first signal charge in the first signal charge path and second signal charge in the second signal charge path may smoothly move to the second semiconductor region 102 or the third semiconductor region 103.

On the other hand, a case where, as with the case of the E region, signal charge paths between the plurality of recessed portions 106 in the first direction (the Y direction) are longer than those in the second direction (the X direction) in a G region will be taken as an example. In this case, signal charge may not move to the second semiconductor region 102 or the third semiconductor region 103 even if the signal charge moves in the signal charge paths, or signal charge is required to detour. Specifically, in this case, the recessed portions 106 are formed across charge movement paths in which the signal charge in the signal charge paths move to the second semiconductor region 102, and therefore, the movement of the signal charge to the second semiconductor region 102 or the third semiconductor region 103 is blocked.

Accordingly, with this configuration of the photoelectric conversion apparatus 100 in this specification, occurrence of a ripple may be addressed while the charge collection efficiency is improved.

Assuming that a region in which the plurality of signal charge paths between the plurality of recessed portions 106 are disposed is determined as a fifth semiconductor region 115, regions between the plurality of recessed portions 106 on the first semiconductor region 101 are the fifth semiconductor region 115 in the photoelectric conversion apparatus 100 illustrated in FIGS. 1A to 1C.

Furthermore, as illustrated in FIG. 2 and FIGS. 3A to 3D, the photoelectric conversion apparatus 100 may include a fourth semiconductor region 104 of the first conductivity type on the principle surface side having the plurality of recessed portions 106 of the semiconductor substrate 400. The fourth semiconductor region 104 is disposed between the plurality of recessed portions 106 in a cross-sectional view of the principle surface, and the plurality of recessed portions 106 are individually surrounded by the fourth semiconductor region 104.

The fourth semiconductor region 104 has an impurity concentration higher than that of the first semiconductor region 101. In this case, the fifth semiconductor region 115 is disposed opposite to the principle surface of the fourth semiconductor region 104 and has an impurity concentration of the first conductivity type lower than that of the fourth semiconductor region 104. Therefore, the fifth semiconductor region 115 may be seen to be signal charge paths between the plurality of recessed portions 106.

The fifth semiconductor region 115 may be the first conductivity type or the second conductivity type as long as the fifth semiconductor region 115 has the impurity concentration of the first conductivity type lower than that of the fourth semiconductor region 104. In FIG. 2 and FIGS. 3A to 3D, a case where the fifth semiconductor region 115 has the first conductivity type and is a portion of the first semiconductor region 101 is illustrated.

The fifth semiconductor region 115 is positioned between the plurality of recessed portions 106 in the cross-sectional view which is perpendicular to the principle surface having the plurality of recessed portions 106. The fifth semiconductor region 115 has a first portion having a length in the first direction which is longer than that in the second direction in the plan view of the one principle surface. The first direction is different from the second direction. Furthermore, the fifth semiconductor region 115 has a second portion having a length in the third direction which is longer than that in the fourth direction in the plan view of the principle surface. The third direction is different from the fourth direction. For example, in FIG. 2, the first, second, third, and fourth directions correspond to the Y, X, X, and Y directions, respectively.

At least one of the second semiconductor region 102 and the third semiconductor region 103 is disposed in a position in the first direction of the first portion of the fifth semiconductor region 115 and in the second direction of the second portion of the fifth semiconductor region 115. That is, at least one of the second semiconductor region 102 and the third semiconductor region 103 includes a region which is on a line parallel to the first direction and passing through the first portion of the fifth semiconductor region 115, and which is on a line parallel to the second direction and passing through the second portion of the fifth semiconductor region 115. Note that it is not necessarily the case that the first and third directions are perpendicular to each other, and the first and the second and third directions are only different from (intersect with) each other.

A configuration of the photoelectric conversion apparatus 100 will be described in detail in embodiments below.

First Embodiment

Figure 2:
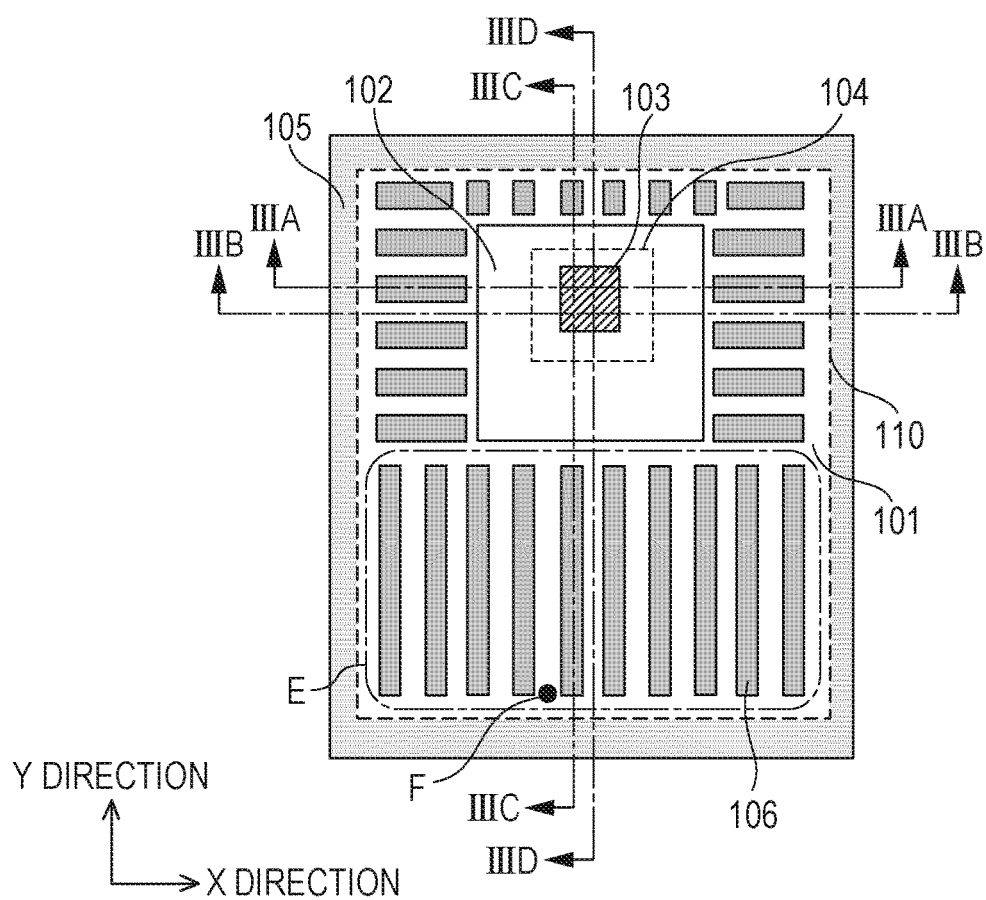
FIG. 2 is a plan view of a portion of the photoelectric conversion apparatus according to the first embodiment.
Figure 3A:
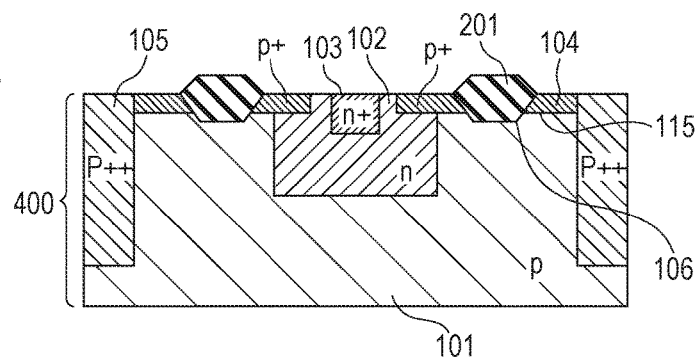
FIGS. 3A to 3D are cross-sectional views of portions of the photoelectric conversion apparatus according to the first embodiment.
Figure 3B:
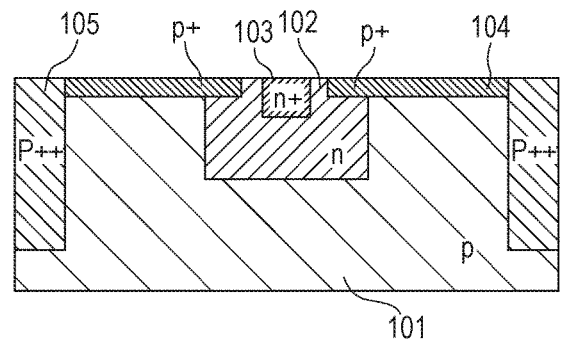
Figure 3C:
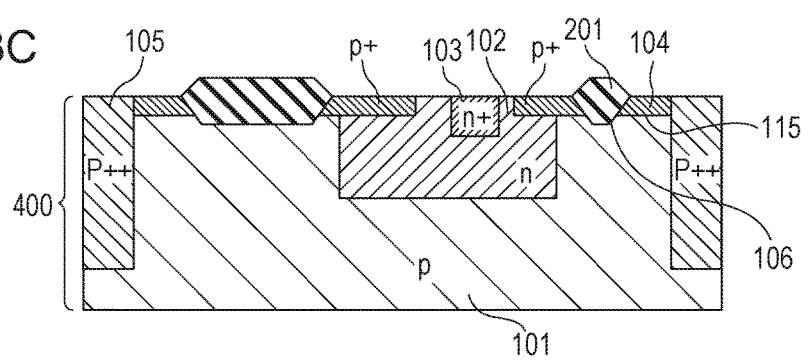
Figure 3D:
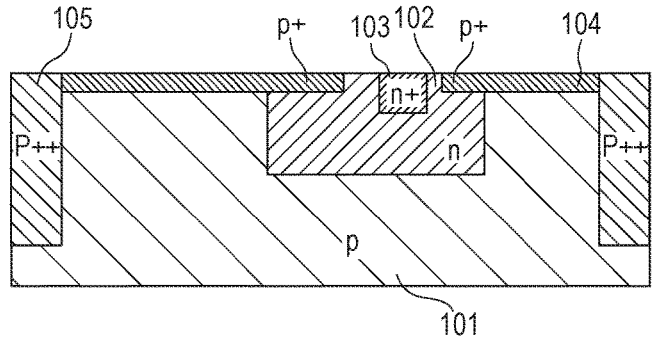
Figure 4:
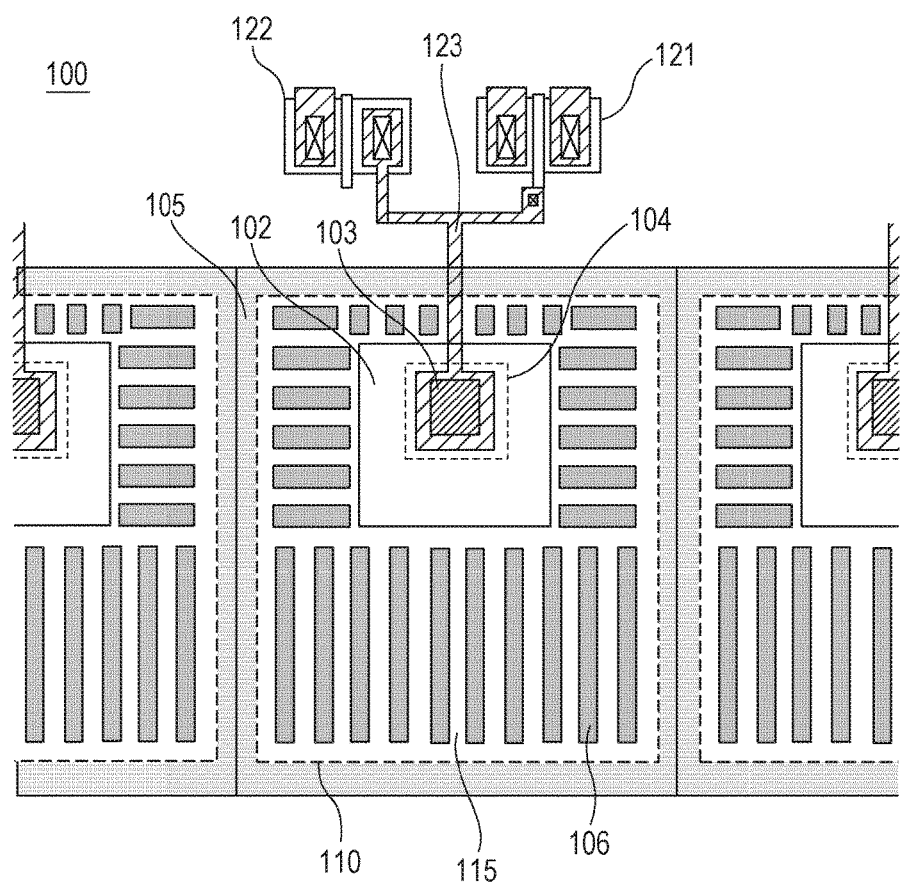
FIG. 4 is a cross-sectional view of a portion of the photoelectric conversion apparatus according to the first embodiment.
Figure 5:
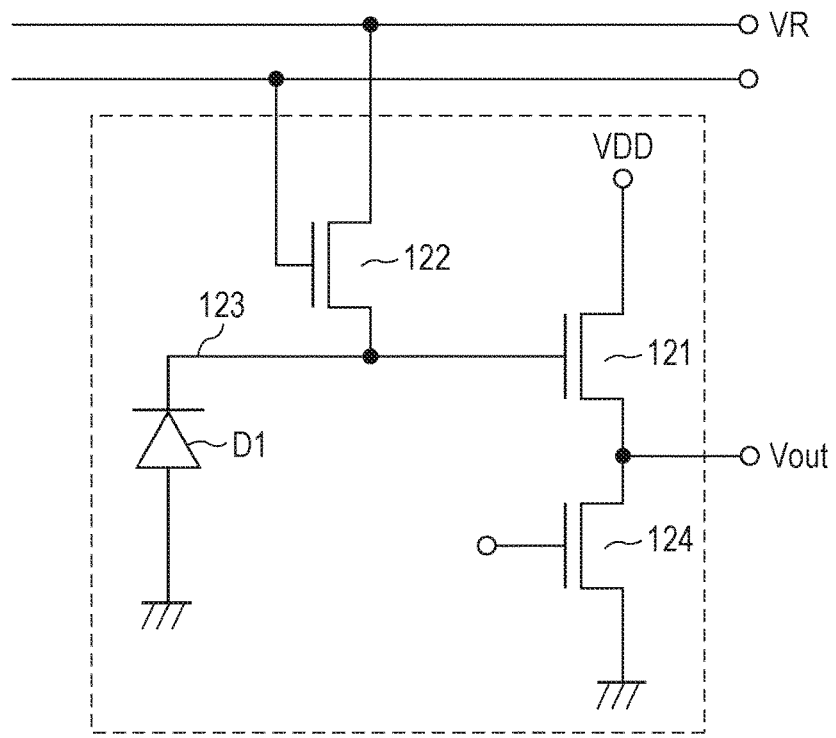
FIG. 5 is a circuit diagram of a portion of the photoelectric conversion apparatus according to the first embodiment.
Figure 6:
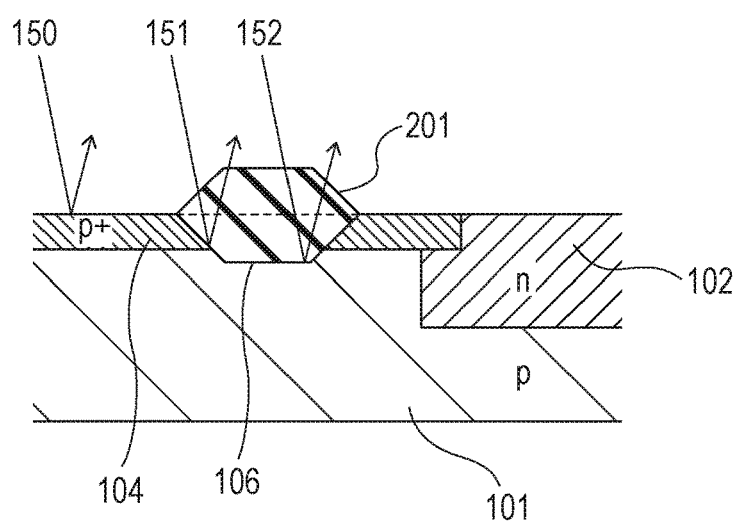
FIG. 6 is a schematic cross-sectional view of a recessed portion according to the first embodiment.
Figure 7A:
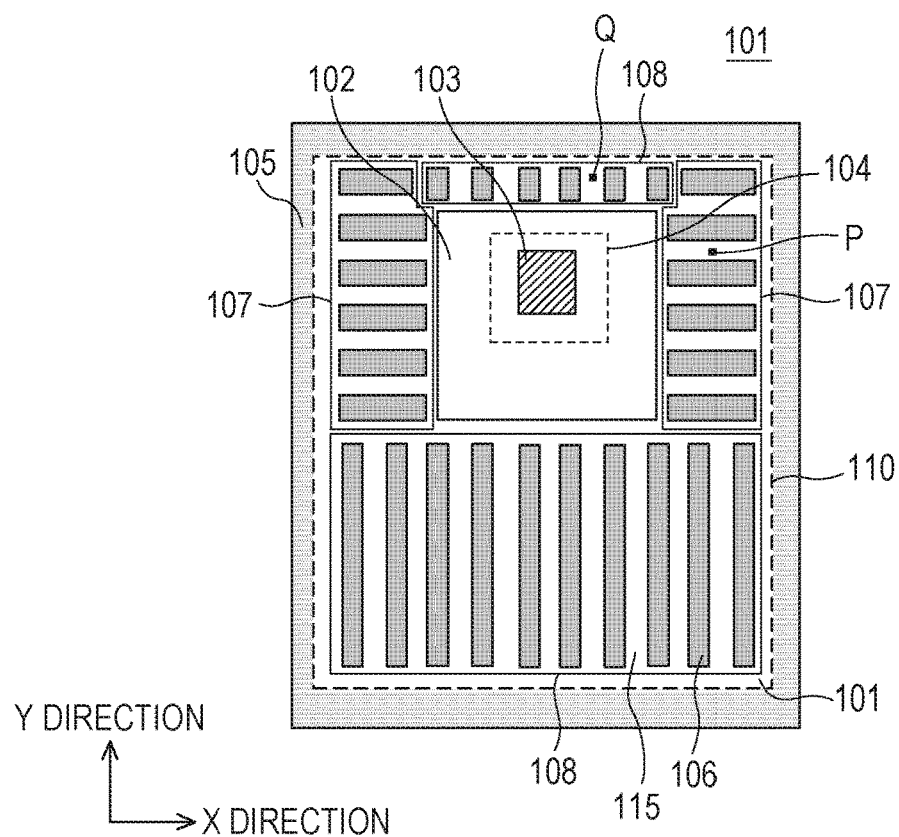
FIGS. 7A and 7B are plan views of portions of the photoelectric conversion apparatus according to the first embodiment.
Figure 7B:
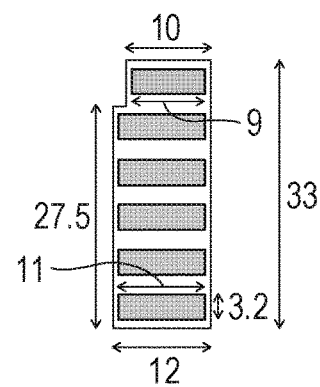
Figure 8A:
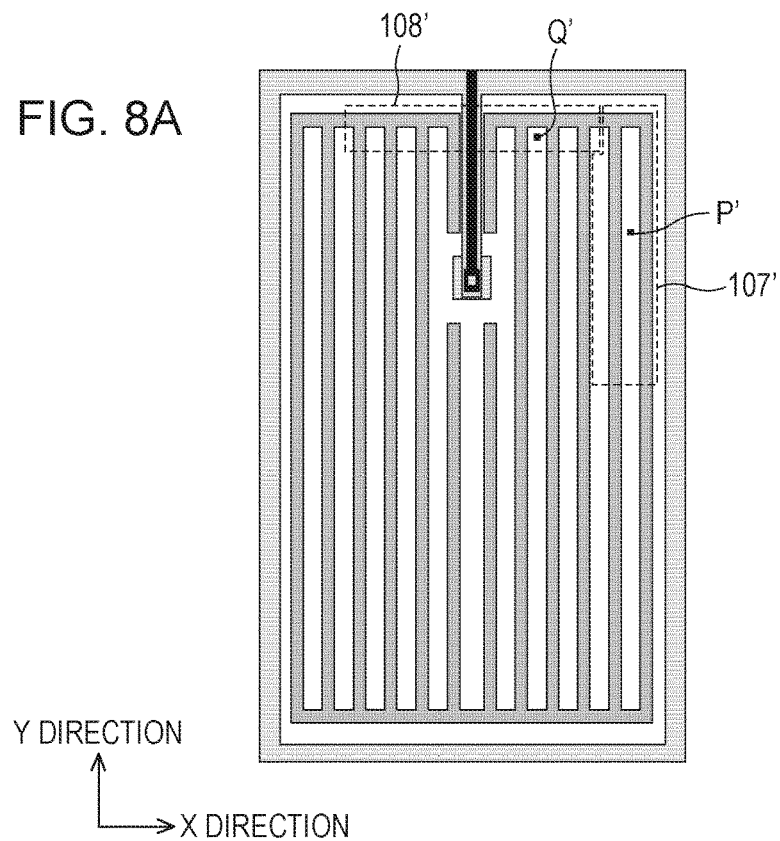
FIGS. 8A and 8B are plan views of a photoelectric conversion apparatus according to a comparative example of the first embodiment.
Figure 8B:
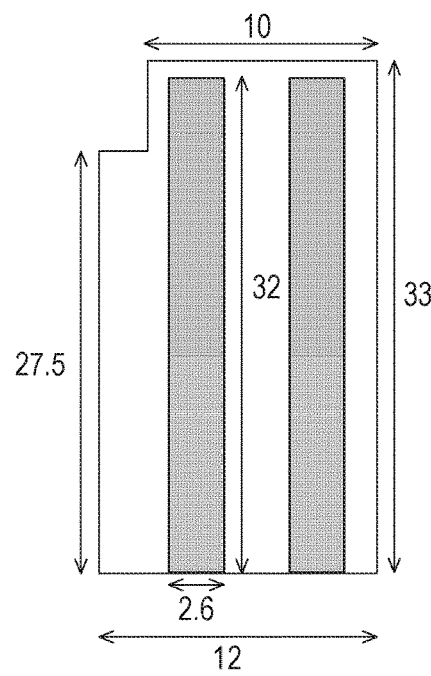

FIGS. 1A and 2 are plan views of a portion of a photoelectric conversion apparatus 100 according to a first embodiment. FIGS. 1B and 1C are schematic cross-sectional views taken along lines IB to IB and IC to IC of FIG. 1A, respectively. FIGS. 3A to 3D are schematic cross-sectional views taking along lines IIIA to IIIA, IIIB to IIIB, IIIC to IIIC, and IIID to IIID of FIG. 2, respectively. FIG. 4 is a schematic plan view of a portion of the photoelectric conversion apparatus 100 according to this embodiment. FIG. 5 is a circuit diagram of a portion of the photoelectric conversion apparatus 100 according to this embodiment, and FIG. 6 is a schematic cross-sectional view of one of recessed portions of the photoelectric conversion apparatus 100 according to this embodiment. FIGS. 7A and 7B are plan views of portions of the photoelectric conversion apparatus 100 according to this embodiment, and FIGS. 8A and 8B are plan views of a photoelectric conversion apparatus according to a comparative example of this embodiment.

Note that the same components in FIGS. 1A to 1C, FIG. 2, FIGS. 3A to 3D, FIGS. 4 to 6, FIGS. 7A and 7B, and FIGS. 8A and 8B are denoted by the same reference numerals.

FIG. 1A is a schematic plan view of an example of a portion of the photoelectric conversion apparatus 100 according to this embodiment. FIGS. 1B and 1C are schematic cross-sectional views taken along a line IB to IB and a line IC to IC in FIG. 1A, respectively.

The photoelectric conversion apparatus 100 includes a semiconductor substrate 400 having a plurality of recessed portions 106 on one principle surface and insulation bodies 201 disposed on the recessed portions 106. In the photoelectric conversion apparatus 100 illustrated in FIGS. 1A to 1C, the semiconductor substrate 400 includes first to third semiconductor regions 101 to 103. In the photoelectric conversion apparatus 100 illustrated in FIG. 2 and FIGS. 3A to 3D, the semiconductor substrate 400 includes the first to third semiconductor regions 101 to 103 and fourth and fifth semiconductor regions 104 and 115. The fifth semiconductor region 115 is a portion of the first semiconductor region 101.

The first semiconductor region 101 may be any of an N type and a P type. In this embodiment, a case where the first semiconductor region 101 is a P-type semiconductor region will be described. A semiconductor substrate serving as a material substrate may be used as the first semiconductor region 101, and a silicon substrate is used in this embodiment, for example.

The second semiconductor region 102 is included in the first semiconductor region 101 and is an N-type semiconductor region. The second semiconductor region 102 forms PN conjunction with the first semiconductor region 101.

The third semiconductor region 103 has an impurity concentration higher than that of the second semiconductor region 102 and is an N-type semiconductor region. In the semiconductor substrate 400, at least a portion of the third semiconductor region 103 is disposed on the principle surface side relative to the second semiconductor region 102. Furthermore, in a first cross section (FIGS. 1B, 1C, 3A, and 3C) which is perpendicular to the principle surface of the semiconductor substrate 400, the third semiconductor region 103 is disposed between first and second recessed portions 106. A portion of the second semiconductor region 102 is located between the first semiconductor region 101 and the third semiconductor region 103 in a depth direction (a direction perpendicular to the principle surface in the first cross section) of the semiconductor substrate 400.

The third semiconductor region 103 collects electrons serving as signal charge which is a majority carrier. Furthermore, the third semiconductor region 103 is electrically connected to a reading circuit. Specifically, the third semiconductor region 103 is connected to the reading circuit through a conductive layer disposed in an opening of an insulation film on the semiconductor substrate 400. Silicon oxide, silicon nitride, or the like may be used for the insulation film on the semiconductor substrate 400.

As illustrated in FIG. 4, the reading circuit includes an amplification transistor 121, a reset transistor 122, and a selection transistor (not illustrated), for example. The amplification transistor 121 and the reset transistor 122 are connected to each other through the third semiconductor region 103 and a conductive line 123. MOS transistors may be used as the amplification transistor 121, the reset transistor 122, and the selection transistor, for example.

Note that, as illustrated in FIG. 4, the photoelectric conversion apparatus 100 includes a plurality of photoelectric conversion elements 110 which are adjacent to one another with an element isolation portion 105 interposed therebetween. Although one of the photoelectric conversion elements 110 and the element isolation portion 105 which surrounds the photoelectric conversion element 110 will be described in detail in this embodiment, the other portions have the same configuration. Therefore, reading circuits and lines connected to the reading circuits of photoelectric conversion elements 110 disposed horizontally adjacent to the target photoelectric conversion element 110 are omitted in FIG. 4.

FIG. 5 is a circuit diagram illustrating a portion of the photoelectric conversion apparatus 100 according to this embodiment. A gate of the amplification transistor 121 and one terminal of the reset transistor 122 are connected to the third semiconductor region 103 in a photoelectric conversion element D1 through a conductive body. The other terminal of the reset transistor 122 is connected to a line VR used to apply a reset reference voltage. The amplification transistor 121 has one terminal connected to a line VDD used to apply a power source voltage, and the other terminal connected to one terminal of a load 124 constituted by a MOS transistor and a signal output line Vout. The load 124 has the other terminal connected to the ground. The load 124 may be used as a selection switch.

As illustrated in FIGS. 1A and 2, at least one of the plurality of recessed portions 106 extends in a first direction (a Y direction) in a plan view of the principle surface including the plurality of recessed portions 106 on the semiconductor substrate 400. Furthermore, at least another one of the plurality of recessed portions 106 extends in a second direction (an X direction) in the plan view. At least one of the second semiconductor region 102 and the third semiconductor region 103 is positioned in a region in the first direction of at least one of the recessed portions 106 and in the second direction of at least the other of the recessed portions 106.

Since the photoelectric conversion apparatus 100 has the configuration described above, the photoelectric conversion apparatus 100 may have the following configuration. Specifically, the semiconductor substrate 400 including the plurality of recessed portions 106 on the principle surface thereof includes signal charge paths (carrier paths) between the plurality of recessed portions 106. The signal charge paths include first and second signal charge paths in the plan view of the principle surface. The first signal charge paths are disposed in a region E of FIG. 1A, for example, and have a length in the first direction (the Y direction) longer than that in the second direction (the X direction) which is different from the first direction. The second signal charge paths are disposed in a region G of FIG. 1A, for example, and has a length in a third direction (the X direction) which is longer than that in a fourth direction (the Y direction). The third direction is different from the first direction and the fourth direction is different from the third direction.

In FIG. 1A, the second semiconductor region 102 and the third semiconductor region 103 are disposed in a region in the first direction of the first signal charge paths and in the second direction of the second signal charge paths. However, the configuration is not limited to this as long as at least one of the second semiconductor region 102 and the third semiconductor region 103 is located in the first direction of the first signal charge paths and in the second direction of the second signal charge paths. In the photoelectric conversion apparatus 100 illustrated in FIGS. 1A to 1C, the fifth semiconductor region 115 serving as a plurality of charge movement paths positioned between the plurality of recessed portions 106 is a portion of the first semiconductor region 101.

With the configuration described above, charge collection efficiency is improved when compared with a case where the second and third semiconductor regions 102 and 103 are formed in one of a region located in a direction in which the first signal charge paths extend and a region located in a direction in which the second signal paths extend. Furthermore, with the configuration described above, charge collection efficiency is improved when compared with a case where the second and third semiconductor regions 102 and 103 are not formed in the region located in the direction in which the first signal charge paths extend or the region located in the direction in which the second signal paths extend.

Furthermore, the photoelectric conversion apparatus 100 of this embodiment may include the fourth semiconductor region 104 between the plurality of recessed portions 106 on the principle surface of the semiconductor substrate 400 as illustrated in FIG. 2 and FIGS. 3A to 3D. The fourth semiconductor region 104 has an impurity concentration higher than that of the first semiconductor region 101 and is a P-type impurity region. The fourth semiconductor region 104 includes a number of the recessed portions 106.

The fourth semiconductor region 104 functions as a dark current suppression region which suppresses dark current by separating a PN junction surface generated between the first semiconductor region 101 and the second semiconductor region 102 from the principle surface of the semiconductor substrate 400. The fourth semiconductor region 104 extends toward the third semiconductor region 103 from a number of the recessed portions 106 which are located closest to the third semiconductor region 103 on the principle surface of the semiconductor substrate 400. Accordingly, a portion of the second semiconductor region 102 is located between the first semiconductor region 101 and the fourth semiconductor region 104 in the depth direction (a direction perpendicular to the principle surface having the plurality of recessed portions 106) of the semiconductor substrate 400.

With the configuration described above, the fifth semiconductor region 115 is disposed on a side of the fourth semiconductor region 104 opposite to the principle surface side, has an impurity concentration of the first conductivity type lower than that of the fourth semiconductor region 104, and is a portion of the first semiconductor region 101. Specifically, the fifth semiconductor region 115 is located between the plurality of recessed portions 106 in the plan view of the principle surface including the plurality of recessed portions 106 of the semiconductor substrate 400 in the first semiconductor region 101. Furthermore, the fifth semiconductor region 115 is located between the plurality of recessed portions 106 in the portion in the first semiconductor region 101 described above in a vertical cross-sectional view of the principle surface.

The element isolation portion 105 is a semiconductor region and may be formed of a P-type semiconductor region, for example. The semiconductor region of the element isolation portion 105 has an impurity concentration higher than that of the fourth semiconductor region 104, separates the adjacent photoelectric conversion elements 110 from each other, and functions as a barrier layer which prevents signal charge from flowing out.

The element isolation portion 105 may totally surround the photoelectric conversion elements 110 in the plan view of the principle surface of the semiconductor substrate 400. Specifically, the plurality of recessed portions 106 and the fourth semiconductor region 104 may be surrounded by the element isolation portion 105. Since the element isolation portion 105 totally surrounds the photoelectric conversion elements 110, charge generated in the photoelectric conversion elements 110 is sufficiently prevented from being leaked.

The second semiconductor region 102 functions such that the second semiconductor region 102 is brought into a depletion state when a reset potential is applied through the third semiconductor region 103 and collects charge while suppressing increase in capacitance. Note that, when a reset voltage is applied to the third semiconductor region 103, the first semiconductor region 101 is not totally brought into a depletion state but includes a neutral region (a region which is not in a depletion state).

The second semiconductor region 102 is disposed, as illustrated in FIGS. 1A to 1C, FIG. 2, and FIGS. 3A to 3D, in contact with the first semiconductor region 101 in the cross section perpendicular to the principle surface including the plurality of recessed portions 106 of the semiconductor substrate 400. Therefore, charge generated in the first semiconductor region 101 which is separated from the second semiconductor region 102 in the cross section moves in the first semiconductor region 101 toward the second semiconductor region 102 before passing the second semiconductor region 102 and being collected by the third semiconductor region 103. Flow of the charge generated in the first semiconductor region 101 to adjacent pixels is suppressed by the element isolation portion 105, and the charge moves while diffusing toward the second semiconductor region 102.

When the charge diffusing in the first semiconductor region 101 reaches a portion in the vicinity of the PN junction between the first semiconductor region 101 and the second semiconductor region 102, the charge moves toward the third semiconductor region 103 due to a drift phenomenon caused by an electric field of the PN junction. If at least a portion of the second semiconductor region 102 and a portion of the first semiconductor region 101 are in contact with each other, the effect described above may be obtained. Furthermore, when a configuration in which the second semiconductor region 102 is surrounded by the first semiconductor region 101 is employed, a larger amount of charge may be collected by the second semiconductor region 102 using the drift phenomenon when compared with a case where the first semiconductor region 101 and the second semiconductor region 102 are in contact with each other in one direction.

When an impurity concentration of the second semiconductor region 102 is higher than that of the first semiconductor region 101, a depletion layer region expands from the second semiconductor region 102 toward the first semiconductor region 101, and therefore, the charge collection efficiency may be improved. Accordingly, the impurity concentration of the second semiconductor region 102 is preferably higher than that of the first semiconductor region 101. When the charge collection efficiency is improved, sensitivity of the photoelectric conversion apparatus 100 is improved. Furthermore, the second semiconductor region 102 may include a plurality of N-type impurity regions having different concentrations.

For example, the second semiconductor region 102 may include a first N-type semiconductor region which is in contact with the first semiconductor region 101 and a second N-type semiconductor region which is in contact with the third semiconductor region 103. In this case, an impurity concentration of the second N-type semiconductor region is higher than that of the first N-type semiconductor region.

Furthermore, when an impurity concentration of the fourth semiconductor region 104 is lower than that of the second semiconductor region 102 and a depletion layer expands toward the fourth semiconductor region 104, the effect of suppression of dark current is lowered. Accordingly, the fourth semiconductor region 104 preferably has an impurity concentration higher than that of the second semiconductor region 102.

Furthermore, thicknesses and impurity concentrations of the first semiconductor region 101, the second semiconductor region 102, the third semiconductor region 103, the fourth semiconductor region 104, and the element isolation portion 105 in a direction perpendicular to the principle surface including the plurality of recessed portions 106 in the photoelectric conversion element 110 may be individually selected from ranges below. Note that a conjunction depth from a surface other than surfaces of the plurality of recessed portions 106 of the semiconductor substrate 400 is used as a parameter of thickness.

The first semiconductor region 101 may have an impurity concentration in a range from $1.0 \times 10^{14}$ cm$^{-3}$ inclusive to $1.0 \times 10^{17}$ cm$^{-3}$ inclusive, or more preferably, a range from $1.0 \times 10^{15}$ cm$^{-3}$ inclusive to $1.0 \times 10^{16}$ cm$^{-3}$ inclusive. Furthermore, a junction depth may be in a range from 0.1 µm inclusive to 1000 µm inclusive. The second semiconductor region 102 may have an impurity concentration in a range from $1.0 \times 10^{13}$ cm$^{-3}$ inclusive to $1.0 \times 10^{17}$ cm$^{-3}$ inclusive, or more preferably, a range from $1.0 \times 10^{14}$ cm$^{-3}$ inclusive to $1.0 \times 10^{16}$ cm$^{-3}$ inclusive. Furthermore, a junction depth may be in a range from 0.2 µm inclusive to 3 µm inclusive.

The third semiconductor region 103 may have an impurity concentration in a range from $1.0 \times 10^{18}$ cm$^{-3}$ inclusive to $1.0 \times 10^{21}$ cm$^{-3}$ inclusive, or more preferably, a range from $1.0 \times 10^{19}$ cm$^{-3}$ inclusive to $1.0 \times 10^{20}$ cm$^{-3}$ inclusive. Furthermore, a junction depth may be in a range from 0.1 µm inclusive to 0.3 µm inclusive.

The fourth semiconductor region 104 may have an impurity concentration in a range from $1.0 \times 10^{15}$ cm$^{-3}$ inclusive to $1.0 \times 10^{19}$ cm$^{-3}$ inclusive, or more preferably, a range from $1.0 \times 10^{16}$ cm$^{-3}$ inclusive to $1.0 \times 10^{18}$ cm$^{-3}$ inclusive. Furthermore, a junction depth may be in a range from 0.1 µm inclusive to 0.5 µm inclusive. The semiconductor region of the element isolation portion 105 may have an impurity concentration in a range from $1.0 \times 10^{14}$ cm$^{-3}$ inclusive to $1.0 \times 10^{19}$ cm$^{-3}$ inclusive, or more preferably, a range from $1.0 \times 10^{15}$ cm$^{-3}$ inclusive to $1.0 \times 10^{18}$ cm$^{-3}$ inclusive. Furthermore, a junction depth may be in a range from 0.1 µm inclusive to 10 µm inclusive.

The plurality of recessed portions 106 are disposed on the principle surface (a light receiving surface) of the semiconductor substrate 400. The plurality of recessed portions 106 may be formed by performing etching on the semiconductor substrate 400 or by performing thermal oxidation on the semiconductor substrate 400 by a local oxidation of silicon (LOCOS) method. The insulation bodies 201 of silicon oxide or the like are formed on the recessed portions 106 when the LOCOS method or a shallow trench isolation (STI) method is used or when an interlayer insulation film is formed on the semiconductor substrate 400.

In this embodiment, a case where the photoelectric conversion apparatus 100 has LOCOS regions formed by the LOCOS method as the insulation bodies 201 is described as an example. In FIGS. 3A and 3C, the fourth semiconductor region 104 is disposed in a position shallower than bottom portions of the recessed portions 106, and the insulation bodies 201 in the recessed portions 106 are in contact with the first semiconductor region 101. Accordingly, the insulation bodies 201 included in the recessed portions 106 penetrate the fourth semiconductor region 104 and reach an inside of the first semiconductor region 101.

Here, in a case where electrons which are signal charge in the fifth semiconductor region 115 move to the second semiconductor region 102, if the recessed portions 106 are disposed across paths of the movement toward the second semiconductor region 102, the movement of the electrons is blocked. However, with the configuration of the photoelectric conversion apparatus 100 of this embodiment, the movement of the electrons toward the second semiconductor region 102 is not blocked at least in two directions. Accordingly, charge collection efficiency may be improved when compared with a case where paths of signal charge which pass at least one of the second semiconductor region 102 and the third semiconductor region 103 extend in one direction among the plurality of recessed portions 106 as illustrated in FIG. 8A.

The plurality of recessed portions 106 illustrated in FIG. 2 will be described in detail with reference to FIGS. 7A, 7B, 8A, and 8B. As illustrated in FIG. 7A, the first semiconductor region 101 includes a plurality of segments 107 and a plurality of segments 108 including the recessed portions 106. FIGS. 8A and 8B are diagrams illustrating portions of a general photoelectric conversion apparatus. As illustrated in FIG. 8A, a first semiconductor region includes segments 107' and 108' including the plurality of recessed portions 106. FIGS. 7B and 8B are diagrams illustrating one of the segments 107 of FIG. 7A and one of the segments 107' of FIG. 8A, respectively, in detail.

In FIG. 7A, the second semiconductor region 102 has a rectangle shape in a plan view, for example. Signal charge paths between the recessed portions 106 extend in the first direction (the Y direction) in the segments 108, and signal charge paths between the recessed portions 106 extend in the second direction (the X direction) in the segments 107. Note that, in this specification, an extending direction of a portion A corresponds to a direction in which a length of the portion A in the extending direction is longer than a length of the portion A in a direction different from (intersecting with) the extending direction. That is, the extending direction of the portion A means a direction of the largest length of the portion A, for example.

Therefore, movement of signal charge in a position P included in the fifth semiconductor region 115 in one of the segments 107 is hardly blocked by the recessed portions 106 in movement paths toward the second semiconductor region 102 and the third semiconductor region 103. Furthermore, movement of signal charge in a position Q included in the fifth semiconductor region 115 in one of the segments 108 is hardly blocked by the recessed portions 106 in the movement paths toward the second semiconductor region 102 and the third semiconductor region 103. Accordingly, the recessed portions 106 are not disposed across the movement paths in the fifth semiconductor region 115 toward the second semiconductor region 102 in at least two directions. Therefore, the movement of the charge may not be blocked and the charge collection efficiency may be improved.

A region including the plurality of recessed portions 106 in one of the photoelectric conversion elements 110 of the photoelectric conversion apparatus 100 in FIG. 7A includes the segments 107 and 108. Therefore, the plurality of recessed portions 106 disposed on the principle surface of the semiconductor substrate 400 extend in the first direction or the second direction. Accordingly, movement of a large amount of signal charge in the fifth semiconductor region 115 toward the second semiconductor region 102 and the third semiconductor region 103 is hardly blocked, and consequently, the photoelectric conversion apparatus 100 which efficiently collects signal charge may be provided.

In the photoelectric conversion apparatus in FIG. 8A, charge paths between the recessed portions 106 in a fifth semiconductor region in the segment 108' extend in a Y direction. Furthermore, charge paths between the recessed portions 106 in a fifth semiconductor region in the segment 107' also extend in the Y direction. Therefore, in a movement path of signal charge in a position P' in the fifth semiconductor region 115 included in the segment 107' toward a third semiconductor region 103, the recessed portions 106 extend in a direction perpendicular to the direction toward the third semiconductor region 103. Accordingly, the signal charge in the position P' may not directly move to the third semiconductor region 103 but moves to the third semiconductor region 103 after moving in the Y direction or through a region on the recessed portions 106 which is opposite to the principle surface of a semiconductor substrate 400. Consequently, charge collection efficiency is lower than that of the photoelectric conversion apparatus 100 illustrated in FIG. 7A.

Furthermore, in a plan view of the principle surface including the plurality of recessed portions 106 in the semiconductor substrate 400, the fourth semiconductor region 104 is disposed in the first semiconductor region 101 on the principle surface side in a region which does not include the recessed portions 106 in a cross section perpendicular to the principle surface. On the other hand, in a region which includes the recessed portions 106 disposed thereon, the insulation bodies 201 included in the recessed portions 106 are in contact with the first semiconductor region 101 in the cross-sectional view, and potential differences are formed in the region including the recessed portions 106.

Accordingly, when the recessed portions 106 are positioned across the charge movement paths as illustrated in FIG. 8A, movement of charge is blocked and charge collection efficiency in the fourth semiconductor region 104 is degraded.

On the other hand, in the segments 107 in FIG. 7A, the second semiconductor region 102 and the third semiconductor region 103 are disposed in a region in a direction in which the signal charge paths between the recessed portions 106 extend. Therefore, the potential differences formed between the first semiconductor region 101 and the recessed portions 106 are not generated in the movement paths of the charge positioned in the point P toward the second semiconductor region 102. With this configuration, not only movement of the charge positioned in the point Q but also movement of the charge positioned in the point P toward the second semiconductor region 102 is not blocked, and charge collection efficiency may be improved.

Next, an operation of reduction of a ripple by the plurality of recessed portions 106 will be described with reference to FIG. 6.

FIG. 6 is a schematic cross-sectional view of a portion where one of the insulation bodies 201 is formed on a corresponding one of the recessed portions 106. Light incident on the semiconductor substrate 400 is denoted by arrow marks 150 to 152. The incident light includes an incident light beam 150 reflected in a region in which the recessed portion 106 is not formed, an incident light beam 151 reflected by a side wall of the recessed portion 106, and an incident light beam 152 reflected by a bottom surface of the recessed portion 106.

Since the recessed portion 106 is formed, different optical path lengths may be obtained when the incident light reaches the semiconductor regions 101, 102, 103, and 104, and phase differences may be obtained among reflection light beams reflected by boundary surfaces between the semiconductor regions 101, 102, 103, and 104 and the insulation body 201. Accordingly, even if output characteristics of the photoelectric conversion apparatus 100 is not uniform and have a wave shape, the non-uniformity may be reduced by interference between the incident light and the reflection light. That is, a ripple of output of the photoelectric conversion apparatus 100 may be reduced by an effect of the interference.

When a depth of the recessed portion 106 is denoted by d, a wavelength of the incident light is denoted by λ, and a refractive index of the insulation body 201 is denoted by n, the following expression is preferably satisfied.

$$d \geq \lambda/4n \qquad \text{Expression 1}$$

Here, a surface of the region which does not include the recessed portions 106 on the semiconductor substrate 400 (a surface other than the plurality of recessed portions 106 on the principle surface on the semiconductor substrate 400) is used as a reference of the depth d.

Furthermore, when a ratio of an area of the recessed portions 106 to an area of a region other than the recessed portions 106 on the photoelectric conversion element 110 is 1:1 in a surface which is parallel to a surface formed by the region which does not include the recessed portions 106 of the photoelectric conversion element 110, a ratio between interference components is also 1:1. Accordingly, a largest effect of reduction of a ripple may be obtained. Consequently, the recessed portions 106 are preferably formed such that a ratio of the area of the recessed portions 106 to the area of the region other than the recessed portions 106 in the semiconductor substrate 400 is 1:1 in the surface which is parallel to the surface formed by the region which does not include the recessed portions 106. Furthermore, the recessed portions 106 are preferably disposed on a plurality of positions.

According to FIG. 7B, in the segments 107, a ratio of the area of the region other than the recessed portions 106 to the area of the recessed portions 106 in the principle surface of the photoelectric conversion element 110 is 88:100 in a surface which is in parallel to a surface of the region which does not include the recessed portions 106 and which includes the surface on the photoelectric conversion element 110. On the other hand, in the photoelectric conversion apparatus 100 illustrated in FIG. 8B, a ratio of an area of a region other than the recessed portions 106 to an area of the recessed portions 106 is 313:100 in a surface which does not include the recessed portions 106 on the photoelectric conversion element 110.

Since the recessed portions 106 in the segment 107 are arranged as illustrated in this embodiment, the ratio of the area of the recessed portions 106 to the area of the region other than the recessed portions 106 in the principle surface of each of the photoelectric conversion elements 110 may become closer to 1:1. Accordingly, occurrence of a ripple in the output of the photoelectric conversion apparatus 100 may be effectively reduced.

On the other hand, if the recessed portions 106 for reducing occurrence of the ripple are formed on the second semiconductor region 102, charge is caught in a portion in which the insulation bodies 201 formed on the recessed portions 106 are in contact with the second semiconductor region 102, such as the LOCOS region or an interlayer film, and therefore, movement of the charge is blocked. Accordingly, the second semiconductor region 102 illustrated in FIG. 2, FIGS. 3A to 3D, FIGS. 4 to 6, and FIGS. 7A and 7B do not include the recessed portions 106. The recessed portions 106 are formed only on the first semiconductor region 101 formed in contact with the second semiconductor region 102 and the fourth semiconductor region 104 which is formed on the first semiconductor region 101 and which has the first conductivity type. By this, influence of the catch of the charge to the movement of the charge may be reduced, and the charge collection efficiency may be further improved.

For example, in the plan view of the principle surface including the recessed portions 106 on the semiconductor substrate 400, the second semiconductor region 102 is formed so as not to overlap with the region including the plurality of recessed portions 106. Specifically, in the first cross-sectional view of the first principle surface of the semiconductor substrate 400 (FIG. 1B), a first recessed portion 106 and a second recessed portion 106 in the plurality of recessed portions 106 are arranged adjacent to each other with the third semiconductor region 103 interposed therebetween in a direction parallel to the principle surface. Furthermore, in the first cross-sectional view, the second semiconductor region 102 is formed between the first recessed portion 106 and the second recessed portion 106.

Furthermore, the PN junction portion formed when the first semiconductor region 101 and the second semiconductor region 102 are in contact with each other is positioned between the first recessed portion 106 and the second recessed portion 106 in the direction in parallel to the principle surface in the first cross-sectional view.

Accordingly, charge may be collected by charge diffusion in the first semiconductor region 101 which is not in the depletion state and charge is collected by the drift phenomenon in the second semiconductor region 102 so that charge collection efficiency is improved. Furthermore, occurrence of a ripple may be addressed when the plurality of recessed portions 106 are formed in the region surrounding the second semiconductor region 102. Note that the third semiconductor region 103 has a function of suppressing dark current on a surface of the semiconductor substrate 400.

Since the recessed portions 106 are not arranged in the second semiconductor region 102 but arranged only in the region surrounding the second semiconductor region 102, the dark current caused by the contact between the insulation bodies 201 in the recessed portions 106 and the second semiconductor region 102 may be prevented from being generated.

Accordingly, a photoelectric conversion apparatus capable of improving charge collection efficiency while reducing occurrence of a ripple of output characteristics may be provided according to this embodiment.

Second Embodiment

FIG. 9 is a plan view schematically illustrating a photoelectric conversion apparatus 100 according to a second embodiment. The cross-sectional views illustrated in FIGS. 3A to 3D are employed. Portions having functions the same as those of the first embodiments are denoted by reference numerals the same as those in the first embodiment and detailed descriptions thereof are omitted.

The photoelectric conversion apparatus 100 according to this embodiment includes segments 207 including signal charge paths which are arranged between a plurality of recessed portions 106 and which extend in an X direction, and segments 208 which include signal charge paths which are arranged between a plurality of recessed portions 106 and which extend in a Y direction. The photoelectric conversion apparatus 100 of this embodiment further includes, in addition to the segments 207 and 208, segments 209 having signal charge paths which are arranged between a plurality of recessed portions 106 and which extend in a direction which intersects with the X direction and the Y direction.

As illustrated in FIG. 9, a second semiconductor region 102 and a third semiconductor region 103 are included in a region positioned in a direction in which the signal charge paths included in the segments 209 extend.

With this configuration, charge in a point B illustrated in FIG. 9 may move to the second semiconductor region 102 while avoiding potential differences formed between the first semiconductor region 101 and the recessed portions 106, and accordingly, charge collection efficiency of the photoelectric conversion apparatus 100 is improved.

That is, in the second embodiment, the charge positioned in the point B in the first semiconductor region 101 may move to the charge collection region faster than the case of the first embodiment, and the charge collection efficiency is further improved.

Third Embodiment

FIG. 10 is a plan view schematically illustrating a portion of a photoelectric conversion apparatus 100 according to a third embodiment. Cross-sectional views the same as those in FIGS. 3A to 3D are employed except that each of the recessed portions 106 in FIGS. 3A and 3C is denoted by a plurality of recessed portions 606. Portions having functions and configurations the same as those of the first embodiments are denoted by reference numerals the same as those in the first embodiment and detailed descriptions thereof are omitted.

In the photoelectric conversion apparatus 100 of this embodiment, a region 506 corresponding to each of the recessed portions 106 is not formed by one recessed portion but formed by a plurality of recessed portions 606. In this embodiment, the plurality of recessed portions 606 may have a length in a longitudinal direction (an extending direction) equal to or smaller than twice a length in a short direction, for example, in a plan view of a principle surface having the recessed portions 606 on a semiconductor substrate 400, for example. Furthermore, the recessed portions 606 may have shapes in which a largest diameter is equal to or smaller than twice a smallest diameter, for example, in the plan view of the principle surface including the recessed portions 606 on the semiconductor substrate 400.

In the plan view, the recessed portions 606 have first signal charge paths 131 having a length in a first direction (a Y direction) longer than a length in a second direction (an X direction) and second signal charge paths 132 having a length in a third direction (the X direction) longer than a length in a fourth direction (the Y direction).

The recessed portions 606 includes first pair of recessed portions 606a and 606b which are disposed adjacent to each other in the second direction (the X direction) with the first signal charge path 131 interposed therebetween, and a second pair of recessed portions 606c and 606d disposed adjacent to each other in the second direction with the first signal charge path 131 interposed therebetween. Specifically, the plurality of recessed portions 606 include the first pair of recessed portions 606a and 606b which are disposed adjacent to each other in the second direction with a first portion of a fifth semiconductor region 115 interposed therebetween in the plan view. Furthermore, the plurality of recessed portions 606 include the second pair of recessed portions 606c and 606d which are disposed adjacent to each other in the second direction with a second portion of the fifth semiconductor region 115 interposed therebetween in the plan view.

Accordingly, in the plan view, the recessed portions 606a and 606c are arranged on one side of the signal charge path 131, and the recessed portions 606b and 606d are arranged on the other side of the signal charge path 131.

The recessed portions 606a and 606c are arranged adjacent to each other in the first direction with a third portion of the fifth semiconductor region 115 interposed therebetween, and the recessed portions 606b and 606d are arranged adjacent to each other in the first direction with a fourth portion of the fifth semiconductor region 115 interposed therebetween.

Similarly, a plurality of recessed portions 606 are arranged on both sides of the second signal charge path 132 in the plan view, and the recessed portions 606 on each of the sides are arranged adjacent to each other with a portion of the fifth semiconductor region 115 interposed therebetween.

Also with this configuration, signal charge in the fifth semiconductor region 115 serving as the signal charge paths between the plurality of recessed portions 606 moving to the second semiconductor region 102 or the third semiconductor region 103 is prevented from being blocked by the recessed portions 606. Accordingly, charge collection efficiency may be improved.

Figure 11:
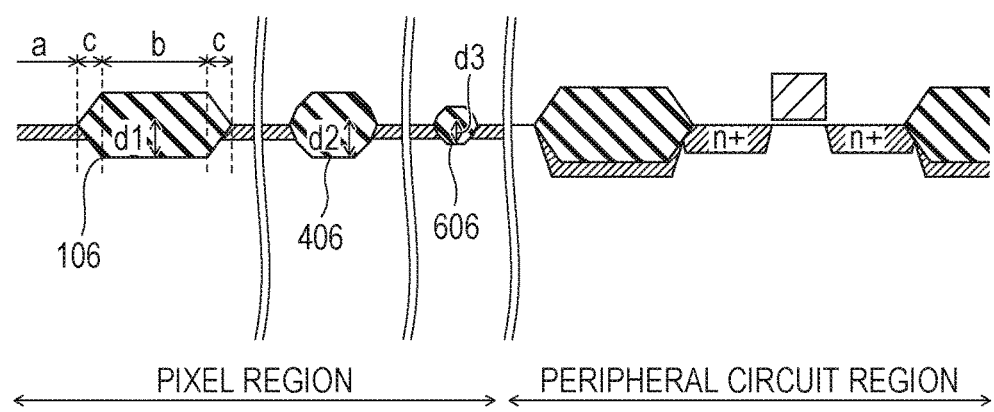
FIG. 11 is a cross-sectional view of recessed portions according to the third embodiment.

The relationship between a width and a thickness of the recessed portions 606 in the example of the portion of the photoelectric conversion apparatus 100 of FIG. 10 is illustrated in FIG. 11.

Shapes of recessed portions 106, 406, and 606 in a pixel region vary depending on widths of the recessed portions 106, 406, and 606. As illustrated in FIG. 11, a flat portion of an active region is denoted by "a", a flat portion in a recessed portion region is denoted by "b", gently-inclined portions which are referred to as a "bird's beak" are denoted by "c", and a depth (a thickness) using a region which does not include a recessed portion as a reference is denoted by "d". In this case, numbers of interference components generated in the region a and the region b may be controlled by the depth (the thickness) d and an area ratio. In the recessed portions 406 and 606, occurrence of a ripple may be reduced by changing various parameters depending on the shapes of the recessed portions 406 and 606.

In this embodiment, when compared with the first and second embodiments, fine roughness may be formed on the principle surface of the photoelectric conversion element 110. Accordingly, charge collection efficiency may be improved while flexibility for layout of the recessed portions for reducing occurrence of a ripple in an output of the photoelectric conversion apparatus 100 is improved.

Fourth Embodiment

Figure 12:
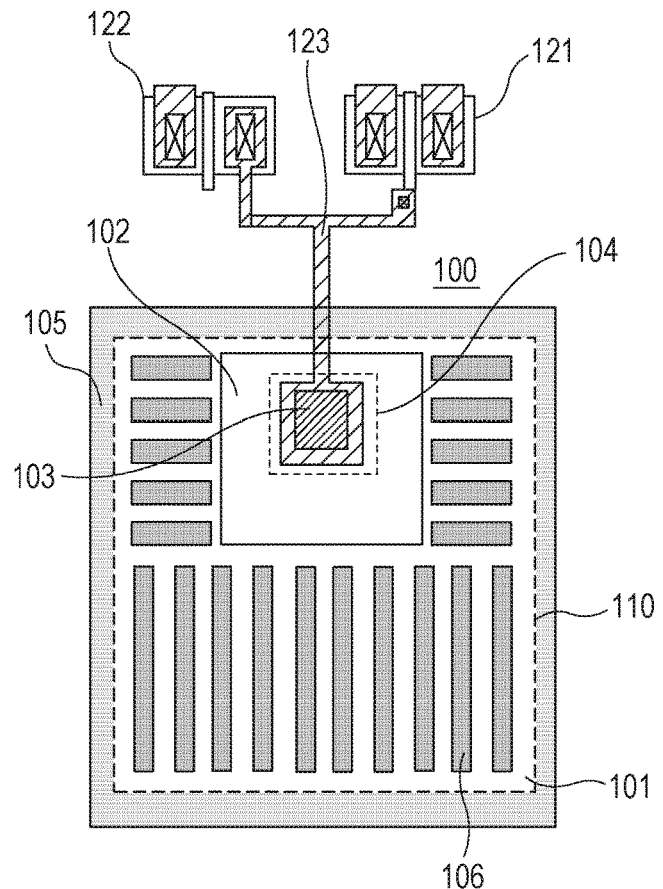
FIG. 12 is a plan view of a portion of a photoelectric conversion apparatus according to a fourth embodiment.

FIG. 12 is a schematic plan view of an example of a portion of a photoelectric conversion apparatus 100 according to a fourth embodiment. Portions having functions and configurations the same as those of the first embodiments are denoted by reference numerals the same as those in the first embodiment and detailed descriptions thereof are omitted. In this embodiment, the photoelectric conversion apparatus 100 may not include recessed portions 106 in a region, on a side near a region in which an element of a reading circuit is formed, in a first semiconductor region 101 which surrounds a second semiconductor region 102 in a plan view. Therefore, in the photoelectric conversion apparatus 100 of this embodiment, a distance between a third semiconductor region 103 for outputting charge to the reading circuit and the reading circuit element is smaller than a distance between the reading circuit element in the photoelectric conversion apparatus 100 and the third semiconductor region 103 according to the first embodiment.

A fourth semiconductor region 104 is connected to an amplification transistor 121 and a reset transistor 122 of the reading circuit through a line 123. A length of the line 123 may be reduced when a position of the fourth semiconductor region 104 is closer to the reading circuit element, and accordingly, parasitic capacitance formed by the line 123, other lines including a ground line, and an insulation film interposed between the line 123 and the other line may be reduced.

Fifth Embodiment

Figure 13:
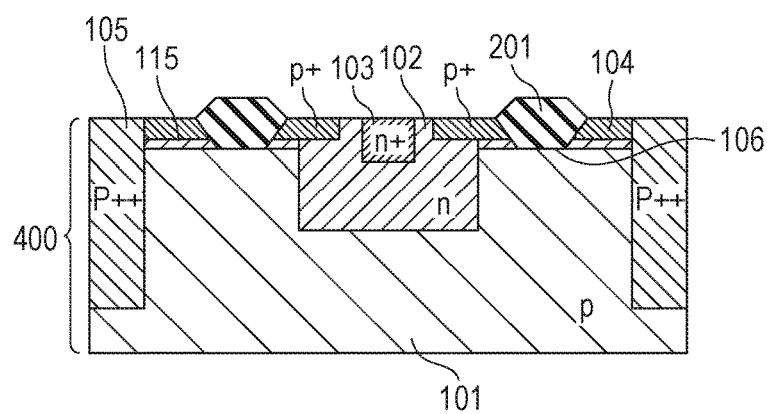
FIG. 13 is a cross-sectional view of a portion of a photoelectric conversion apparatus according to a fifth embodiment.

A portion of a photoelectric conversion apparatus 100 according to a fifth embodiment will be described with reference to FIG. 13. FIG. 13 is a cross-sectional view schematically illustrating a portion of the photoelectric conversion apparatus 100 according to this embodiment. The plan view of the first embodiment illustrated in FIG. 2 may be employed. The photoelectric conversion apparatus 100 of FIG. 13 is different from that in FIGS. 3A to 3D in that a semiconductor region of a second conductivity type is formed on a side opposite to a principle surface of a fourth semiconductor region 104 in a cross-sectional view of the principle surface including a plurality of recessed portions 106 on a semiconductor substrate 400. Specifically, in this embodiment, the semiconductor region corresponds to a fifth semiconductor region 115.

An impurity concentration of the fifth semiconductor region 115 is equal to or lower than that of the second semiconductor region 102 and lower than that of the third semiconductor region 103. Accordingly, signal charge generated in the fifth semiconductor region 115 is collected by the second semiconductor region 102. Also in this embodiment, when an extending direction of the fifth semiconductor region 115 serving as signal charge paths and the positional relationship between the second semiconductor region 102 and the third semiconductor region 103 are set the same as those of the first embodiment, charge collection efficiency may be improved.

Note that a configuration of the photoelectric conversion apparatus 100 of this embodiment is not limited to the configuration described above, and the photoelectric conversion apparatus 100 of FIG. 1 and any one of photoelectric conversion elements according to the second to fourth embodiments may be combined with each other.

Sixth Embodiment

Figure 14A:
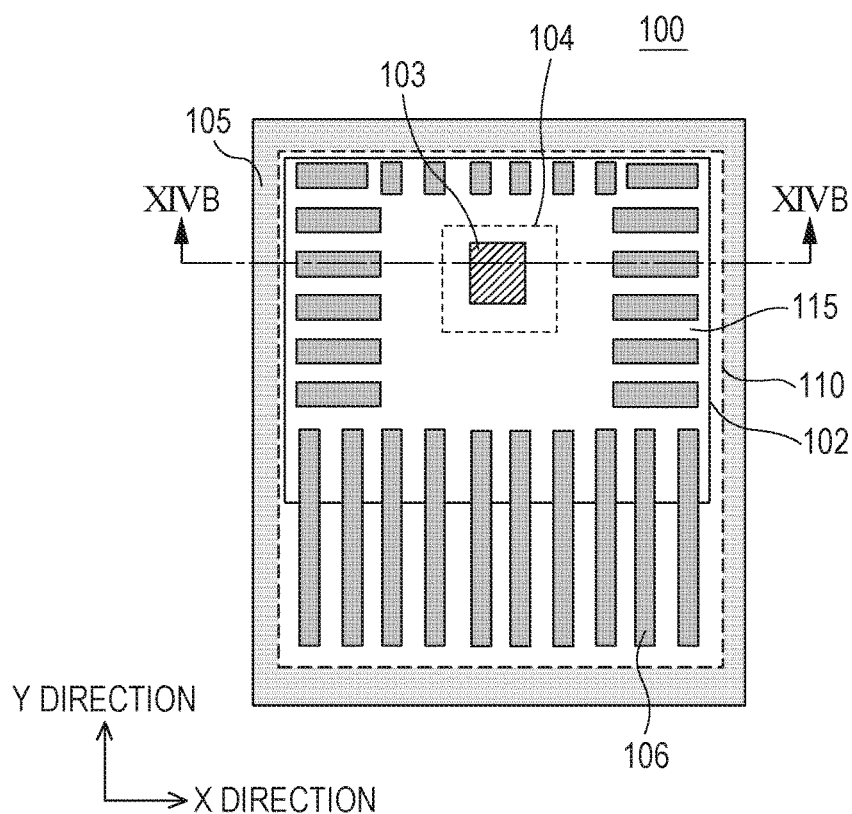
FIGS. 14A and 14B are plan views of portions of a photoelectric conversion apparatus according to a sixth embodiment.
Figure 14B:
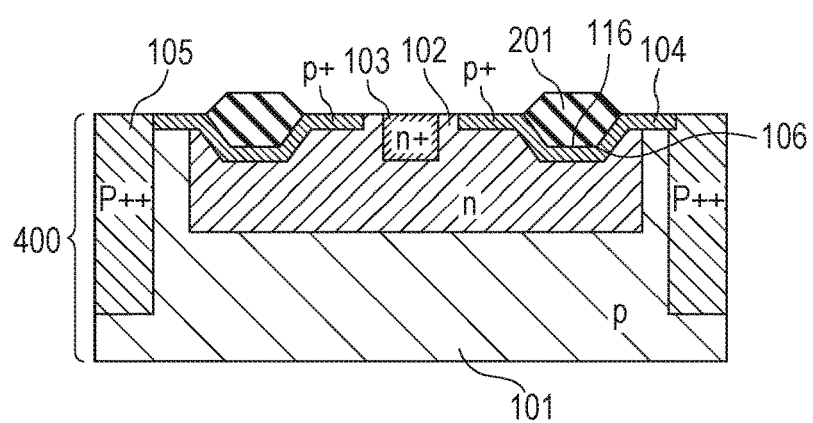

A portion of a photoelectric conversion apparatus 100 according to a sixth embodiment will be described with reference to FIGS. 14A and 14B. FIG. 14A is a plan view of an example of a portion of the photoelectric conversion apparatus 100 of this embodiment, and FIG. 14B is a schematic cross-sectional view of an example of a portion of the photoelectric conversion apparatus 100 taken along a line XIVB to XIVB in FIG. 14A. The photoelectric conversion apparatus 100 of this embodiment is different from that of the first embodiment in that a fifth semiconductor region 115 is a portion of a second semiconductor region 102, and sixth semiconductor regions 116 are formed in regions in which the insulation bodies 201 included in a plurality of recessed portions 106 of a semiconductor substrate 400 are in contact with the second semiconductor region 102. The sixth semiconductor regions 116 preferably have a first conductivity type and preferably have an impurity concentration higher than those of a first semiconductor region 101, the second semiconductor region 102, and the fifth semiconductor region 115. Here, a case where portions of the fourth semiconductor region 104 formed along the recessed portions 106 correspond to the sixth semiconductor regions 116 will be described.

If the insulation bodies 201 included in the plurality of recessed portions 106 are in contact with the second semiconductor region 102, dark current which causes boundary defects in the insulation bodies 201 may be generated. Since the fourth semiconductor region 104 is disposed between the insulation bodies 201 and the second semiconductor region 102 in the photoelectric conversion apparatus 100 of this embodiment, even if charge of a second conductivity type having a polarity the same as that of signal charge is generated, the dark current may be suppressed by recombination in the fourth semiconductor region 104.

Accordingly, in a plan view of a principle surface including the plurality of recessed portions 106 on the semiconductor substrate 400, the second semiconductor region 102 may extend from a portion in contact with the third semiconductor region 103 to a region in which the second semiconductor region 102 overlaps with at least some of the plurality of recessed portions 106. Current collection efficiency may be further improved by increasing a region of the second semiconductor region 102.

On the other hand, even though the sixth semiconductor regions 116 are disposed, a region having a low impurity concentration may be generated in the vicinity of the recessed portions 106. A potential of signal charge is low in the region having a low impurity concentration, and therefore, a time constant becomes larger when accumulated charge is discharged which causes an image lag phenomenon. If such a disadvantage is expected, the second semiconductor region 102 is disposed nearer to the third semiconductor region 103 relative to one of the recessed portions 106 which is closest to the third semiconductor region 103 in the plan view as illustrated in the other embodiments. Accordingly, in the plan view, the second semiconductor region 102 does not overlap with the plurality of recessed portions 106. With this configuration, generation of the image lag phenomenon may be suppressed.

Note that a configuration of the photoelectric conversion apparatus 100 of this embodiment is not limited to the configuration described above, and the photoelectric conversion apparatus 100 of FIG. 1 may be combined with any one of the photoelectric conversion elements 110 according to the second to fourth embodiments.

Seventh Embodiment

Figure 15:
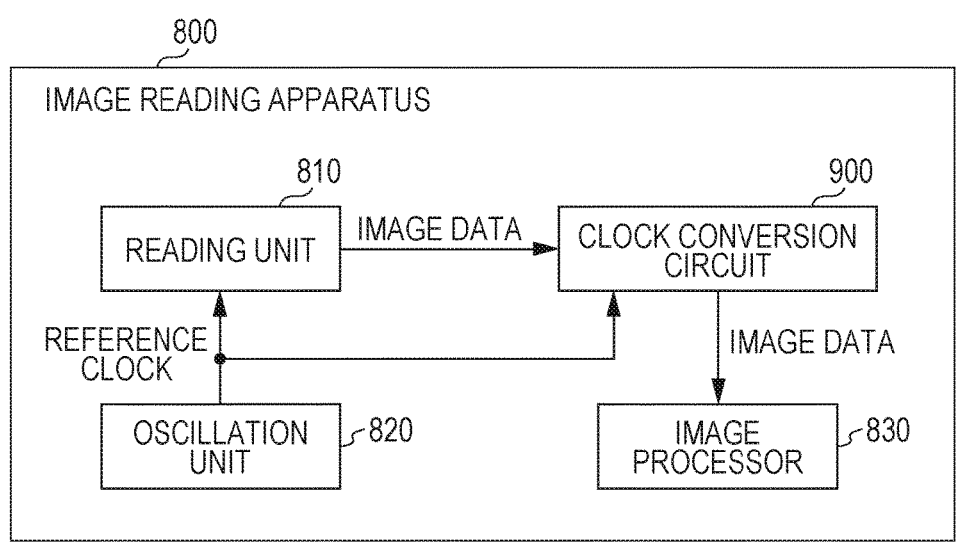
FIG. 15 is a diagram illustrating an image reading apparatus according to a seventh embodiment.

A configuration of an image reading apparatus 800 according to a seventh embodiment of the present invention will be described with reference to a block diagram of FIG. 15. The image reading apparatus 800 may be a multifunction peripheral (MFP), a scanner, or a copier, for example. The image reading apparatus 800 may include a clock conversion circuit 900, a reading unit 810, an oscillation circuit 820, and an image processor 830.

The reading unit 810 generates image data by reading a document. The reading unit 810 may include a light source, a size-reduced optical part, a licenser, an analog/digital converter, and a controller. One of the photoelectric conversion apparatuses 100 according to the first to sixth embodiments may be used as the licenser. The oscillation circuit 820 supplies a generated reference clock to the reading unit 810 and the clock conversion circuit 900. The reading unit 810 operates in accordance with the supplied reference clock. A frequency of the reference clock may be several hundred MHz, for example.

The clock conversion circuit 900 receives the image data from the reading unit 810 in accordance with the reference clock as described above and supplies the image data to the image processor 830 in accordance with a spectrum diffusion clock. The image processor 830 processes the supplied image data. Accordingly, the image processor 830 processes data based on the image data output from the reading unit 810.

The reading unit 810, the oscillation circuit 820, and the clock conversion circuit 900 may be disposed in a movable portion of the image reading apparatus 800, and the image processor 830 may be disposed on a body portion of the image reading apparatus 800. The clock conversion circuit 900 and the image processor 830 may be connected to each other through a wire harness of several tens of centimeters, for example.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-103716 filed May 24, 2016, which is hereby incorporated by reference herein in its entirety.

What is claimed is:
1. A photoelectric conversion apparatus comprising:
a semiconductor substrate configured to have one principle surface including recessed portions; and insulation bodies configured to be disposed in the recessed portions, wherein the semiconductor substrate includes photoelectric conversion elements each of which includes a first semiconductor region of a first conductivity type, a second semiconductor region of a second conductivity type which is opposite to the first conductivity type, and a third semiconductor region of the second conductivity type which has an impurity concentration higher than an impurity concentration of the second semiconductor region, and which has at least a portion disposed nearer to the principle surface relative to the second semiconductor region, the second semiconductor region having a polarity the same as a polarity of signal charge, wherein:

the second semiconductor region is in contact with the first and third semiconductor regions, the first and second semiconductor regions form a PN junction portion, signal charge paths are disposed between the recessed portions in a cross section perpendicular to the principle surface, the signal charge paths include, in a plan view of the principle surface, a first signal charge path having a length in a first direction longer than a length in a second direction which is different from the first direction, and a second signal charge path having a length in a third direction, which is different from the first direction, longer than a length in a fourth direction which is different from the third direction, and at least one of the second and third semiconductor regions includes a region which is on a line parallel to the first direction and passing through the first signal charge path, and which is on a line parallel to the second direction and passing through the second signal charge path.

2. The photoelectric conversion apparatus according to claim 1, the semiconductor substrate further including:

a fourth semiconductor region of the first conductivity type which is disposed in a region nearer to the principle surface relative to the first semiconductor region in the semiconductor substrate in a cross section perpendicular to the principle surface, and which surrounds the second and third semiconductor regions in the plan view of the principle surface, wherein:

an impurity concentration of the fourth semiconductor region is higher than an impurity concentration of the first semiconductor region, and the recessed portions are surrounded by the fourth semiconductor region in the plan view of the principle surface.

3. The photoelectric conversion apparatus according to claim 2, wherein the first semiconductor region overlaps with the second semiconductor region and the recessed portions in the plan view of the principle surface, and the insulation bodies included in the recessed portions have a depth to bottoms from the principle surface of the semiconductor substrate which is deeper than a depth of the fourth semiconductor region.

4. The photoelectric conversion apparatus according to claim 1, wherein the recessed portions include:

a first pair of the recessed portions which are arranged adjacent to each other in the second direction and which sandwich the first signal charge path; and a second pair of the recessed portions which are arranged adjacent to each other in the second direction and which sandwich the first signal charge path.

5. The photoelectric conversion apparatus according to claim 2, further comprising:

an element isolation portion arranged to surround the fourth semiconductor region in the plan view of the principle surface, wherein the recessed portions are surrounded by the element isolation portion.

6. The photoelectric conversion apparatus according to claim 2, wherein a portion of the second semiconductor region is located between the first and fourth semiconductor regions in a direction perpendicular to the principle surface.

7. The photoelectric conversion apparatus according to claim 2, wherein an impurity concentration of the fourth semiconductor region is higher than an impurity concentration of the second semiconductor region.

8. The photoelectric conversion apparatus according to claim 6, wherein the second semiconductor region overlaps with the recessed portions in the plan view of the principle surface.

9. The photoelectric conversion apparatus according to claim 1, wherein:

first and second recessed portions in the recessed portions are arranged adjacent to each other so as to sandwich the second and third semiconductor regions in a first cross section perpendicular to the principle surface, the second semiconductor region is in contact with the first semiconductor region in the first cross section, and the PN junction portion formed by the first and second semiconductor regions is positioned between the first and second recessed portions in the first cross section.

10. The photoelectric conversion apparatus according to claim 9, wherein:

third and fourth recessed portions in the recessed portions are arranged adjacent to each other so as to sandwich the third semiconductor region in a second cross section which intersects with the first cross section perpendicular to the principle surface, and the second semiconductor region is formed between the third and fourth recessed portions in the second cross section and the PN junction portion formed by the first and second semiconductor regions is positioned between the third and fourth recessed portions in the second cross section.

11. The photoelectric conversion apparatus according to claim 1, wherein the recessed portions overlap with the first semiconductor region in the plan view of the principle surface.

12. The photoelectric conversion apparatus according to claim 1, wherein the third semiconductor region is surrounded by the second semiconductor region in the plan view of the principle surface.

13. The photoelectric conversion apparatus according to claim 1, wherein a portion of the second semiconductor region is located between the first and third semiconductor regions in a direction perpendicular to the principle surface.

14. The photoelectric conversion apparatus according to claim 1, wherein the insulation bodies are formed of silicon oxide.

15. The photoelectric conversion apparatus according to claim 1, wherein the insulation bodies correspond to local oxidization of silicon (LOCOS) regions.

16. The photoelectric conversion apparatus according to claim 1, wherein the insulation bodies correspond to interlayer insulation films formed on the semiconductor substrate.

17. The photoelectric conversion apparatus according to claim 1, wherein an impurity concentration of the second semiconductor region is higher than an impurity concentration of the first semiconductor region.

18. The photoelectric conversion apparatus according to claim 1, further comprising a conductive layer which is in contact with the third semiconductor region through an opening formed on an insulation film formed on the semiconductor substrate.

19. An image reading apparatus comprising:
a reading unit configured to include the photoelectric conversion apparatus according to claim 1 and generate image data by reading a document; and
a processor configured to process data based on the image data.

20. A photoelectric conversion apparatus comprising:
a semiconductor substrate configured to have one principle surface including recessed portions; and
insulation bodies configured to be disposed in the recessed portions,
wherein the semiconductor substrate includes photoelectric conversion elements each of which includes:
a first semiconductor region of a first conductivity type;
a second semiconductor region of a second conductivity type which has a polarity the same as a polarity of signal charge and which is opposite to the first conductivity type;
a third semiconductor region of the second conductivity type which has an impurity concentration higher than an impurity concentration of the second semiconductor region, and which has at least a portion disposed nearer to the principle surface relative to the second semiconductor region;
a fourth semiconductor region of the first conductivity type which is formed between the recessed portions in a cross section perpendicular to the principle surface, and which has an impurity concentration higher than an impurity concentration of the first semiconductor region; and
a fifth semiconductor region which is formed in a depth direction of the fourth semiconductor region in the cross section perpendicular to the principle surface, and which has an impurity concentration of the first conductivity type lower than the impurity concentration of the fourth semiconductor region,
wherein:
the second semiconductor region is in contact with the first and third semiconductor regions,
the first and second semiconductor regions form a PN junction portion,
the fifth semiconductor region is positioned between the recessed portions in the cross section perpendicular to the principle surface,
the fifth semiconductor region includes, in a plan view of the principle surface,
a first portion having a length in a first direction longer than a length in a second direction which is different from the first direction, and
a second portion having a length in a third direction, which is different from the first direction, longer than a length in a fourth direction which is different from the third direction, and at least one of the second semiconductor region and the third semiconductor region includes a region which is on a line parallel to the first direction and passing through the first portion of the fifth semiconductor region and which is on a line parallel to the second direction passing through the second portion of the fifth semiconductor region.

21. The photoelectric conversion apparatus according to claim 20, wherein:
the first semiconductor region overlaps with the second semiconductor region and the recessed portions in the plan view of the principle surface, and
the fifth semiconductor region is a portion of the first semiconductor region.

22. The photoelectric conversion apparatus according to claim 20, wherein the fifth semiconductor region of the second conductivity type has an impurity concentration lower than an impurity concentration of the third semiconductor region.

23. The photoelectric conversion apparatus according to claim 20, wherein the fifth semiconductor region is a portion of the second semiconductor region, and the second semiconductor region overlaps with at least a number of the recessed portions in a plan view of the principle surface.

24. The photoelectric conversion apparatus according to claim 20,
wherein the recessed portions include
a first pair of recessed portions which are arranged adjacent to each other so as to sandwich the first portion of the fifth semiconductor region in the second direction, and
a second pair of recessed portions which are arranged adjacent to each other so as to sandwich the second portion of the fifth semiconductor region in the second direction.

25. The photoelectric conversion apparatus according to claim 20, further comprising:
an element isolation portion arranged to surround the fourth semiconductor region in the plan view of the principle surface,
wherein the recessed portions are surrounded by the element isolation portion.

26. The photoelectric conversion apparatus according to claim 20, wherein a portion of the second semiconductor region is located between the first and fourth semiconductor regions in a direction perpendicular to the principle surface.

27. The photoelectric conversion apparatus according to claim 20, wherein an impurity concentration of the fourth semiconductor region is higher than an impurity concentration of the second semiconductor region.

28. The photoelectric conversion apparatus according to claim 21, wherein the second semiconductor region overlaps with the recessed portions in the plan view of the principle surface.

29. The photoelectric conversion apparatus according to claim 20, wherein:
first and second recessed portions in the recessed portions are arranged adjacent to each other so as to sandwich the second and third semiconductor regions in a first cross section perpendicular to the principle surface,
the second semiconductor region is in contact with the first semiconductor region in the first cross section, and
the PN junction portion formed by the first and second semiconductor regions is positioned between the first and second recessed portions in the first cross section.

30. The photoelectric conversion apparatus according to claim 29, wherein:

third and fourth recessed portions in the recessed portions are arranged adjacent to each other so as to sandwich the third semiconductor region in a second cross section which intersects with the first cross section perpendicular to the principle surface, and the second semiconductor region is formed between the third and fourth recessed portions in the second cross section and the PN junction portion formed by the first and second semiconductor regions is positioned between the third and fourth recessed portions in the second cross section.

31. The photoelectric conversion apparatus according to claim 20, wherein the recessed portions overlap with the first semiconductor region in the plan view of the principle surface.

32. The photoelectric conversion apparatus according to claim 20, wherein the third semiconductor region is surrounded by the second semiconductor region in the plan view of the principle surface.

33. The photoelectric conversion apparatus according to claim 20, wherein a portion of the second semiconductor region is located between the first and third semiconductor regions in a direction perpendicular to the principle surface.

34. The photoelectric conversion apparatus according to claim 20, wherein the insulation bodies are formed of silicon oxide.

35. The photoelectric conversion apparatus according to claim 20, wherein the insulation bodies correspond to local oxidization of silicon (LOCOS) regions.

36. The photoelectric conversion apparatus according to claim 20, wherein the insulation bodies correspond to interlayer insulation films formed on the semiconductor substrate.

37. The photoelectric conversion apparatus according to claim 20, wherein an impurity concentration of the second semiconductor region is higher than an impurity concentration of the first semiconductor region.

38. The photoelectric conversion apparatus according to claim 20, further comprising a conductive layer which is in contact with the third semiconductor region through an opening formed on an insulation film formed on the semiconductor substrate.

39. An image reading apparatus comprising:

a reading unit configured to include the photoelectric conversion apparatus according to claim 20 and generate image data by reading a document; and a processor configured to process data based on the image data.

* * * * *